(12) United States Patent
Georgiev et al.

(10) Patent No.: US 7,402,445 B2
(45) Date of Patent: Jul. 22, 2008

(54) METHOD OF FORMING MICRO-STRUCTURES AND NANO-STRUCTURES

(75) Inventors: Daniel G. Georgiev, Farmington Hills, MI (US); Ivan Avrutsky, Troy, MI (US); Ronald J. Baird, Grosse Ile, MI (US); Golam Newaz, Ann Arbor, MI (US); Gregory W. Auner, Livonia, MI (US)

(73) Assignee: Wayne State University, Detroit, MI (US)

( * ) Notice: Subject to any disclaimer, the term of this patent is extended or adjusted under 35 U.S.C. 154(b) by 307 days.

(21) Appl. No.: 11/433,003

(22) Filed: May 12, 2006

(65) Prior Publication Data

US 2006/0258133 A1 Nov. 16, 2006

Related U.S. Application Data

(60) Provisional application No. 60/681,295, filed on May 16, 2005.

(51) Int. Cl.
 *H01L 21/00* (2006.01)
(52) U.S. Cl. .................. 438/20; 438/778; 438/799; 977/815; 977/900; 977/939
(58) Field of Classification Search .................. 438/20, 438/799, 778; 977/815, 900, 939
See application file for complete search history.

(56) References Cited

U.S. PATENT DOCUMENTS 5,431,126 A * 7/1995 Sameshima et al. ........... 117/43
5,599,749 A * 2/1997 Hattori ........................ 216/11
6,057,172 A * 5/2000 Tomihari ..................... 438/20
6,607,415 B2 * 8/2003 Dunfield et al. .............. 445/50
2005/0282301 A1 * 12/2005 Gilton et al. ................. 438/20
2006/0084192 A1 * 4/2006 Zhang ......................... 438/20

OTHER PUBLICATIONS

Dieter Bäuerle, entitled "Laser Processing and Chemistry," Third, Revised and Enlarged Edition With 314 Figures and 13 Tables, Chapter 10, entitled "Surface Melting," pp. 165-182; Chapter 11, entitled "Vaporization, Plasma Formation," pp. 187-219; Chapter 12, entitled "Nanosecond-Laser Ablation," pp. 221-257; Chapter 28, entitled "Instabilities and Structure Formation," pp. 517-616.

Teiichirou Chiba, et al. entitled "Formation of Micropeak Array on a Silicon Wafer," The Japan Society of Applied Physics, Aug. 2000, vol. 39, Part 1, No. 8, pp. 4803-4810.

(Continued)

*Primary Examiner*—Fernando L. Toledo
*Assistant Examiner*—Jarrett J Stark
(74) *Attorney, Agent, or Firm*—Brinks Hofer Gilson & Lione

(57) ABSTRACT

Methods of forming a nano-structure for electron extraction are disclosed. One method of forming a nano-structure comprises irradiating an area on a first surface of a thermal conductive film to melt the area across the film. The film is insulated on a second surface to provide two-dimensional heat transfer across the film. The liquid density of the film is greater than the solid density thereof. The method further comprises cooling the area inwardly from the periphery thereof to form a nano-structure having an apical nano-tip for electron extraction.

26 Claims, 7 Drawing Sheets

OTHER PUBLICATIONS

D.G. Georgiev, et al., entitled "X-ray photoelectron spectroscopy study of excimer laser treated alumina films," Appl. Phys. Lett. 72 (1), Jan. 5, 1998, pp. 31-33.

C.A. Spindt, et al., entitled "Physical properties of thin-film field emission cathodes with molybdenum cones," Journal of Applied Physics, vol. 47, No. 12, Dec. 1976, pp. 5248-5263.

L. Dvorson, et al., entitled "Double-gated silicon field emitters," J. Vac. Sci. Technol. B 21(1), Jan./Feb. 2003, pp. 486-494.

Heinz H. Busta, entitled "Vacuum microelectronics," J. Micromech. Microeng. 2 (1992), pp. 43-74.

S. Tuner, et al., entitled "Cell attachment on silicon nanostructures," J. Vac. Sci. Technol. B 15(6), Nov./Dec. 1997, pp. 2848-2854.

A.M.P. Tuner, et al., entitled "Attachment of astroglial cells to microfabricated pillar arrays of different geometries," J. Biomed Mater Res., 51, 2000, pp. 430-441.

Michael P. Maher, et al., entitled "The neurochip: a new multielectrode device for stimulating and recording from cultured neurons," Journal of Neuroscience Methods 87 (1999), pp. 45-56.

Tsing-Hua Her, et al., entitled "Microstructuring of silicon with femtosecond laser pulses," Applied Physics Letters, vol. 73, No. 12, Sep. 21, 1998, pp. 1673-1675.

A.J. Pedraza, et al., entitled "Silicon microcolumn arrays grown by nanosecond pulsed-excimer laser irradiation," Applied Physics Letters, vol. 74, No. 16, Apr. 19, 1999, pp. 2322-2324.

F. Sánchez, et al., entitled "Dynamics of the hydrodynamical growth of columns of silicon exposed to ArF excimer-laser irradiation," Appl. Phys. A 66 (1998), pp. 83-86.

F. Sánchez, et al., entitled "Whiskerlike structure growth on silicon exposed to ArF excimer laser irradiation," Appl. Phys. Lett. 69 (5), Jul. 29, 1996, pp. 620-622.

S.I. Dolgaev, et al., entitled "Formation of conical microstructures upon laser evaporation of solids," Appl. Phys. A 73 (2001), pp. 177-181.

A.J. Pedraza, et al., entitled "Surface nanostructuring of silicon," Appl. Phys. A 77 (2003), pp. 277-284.

Ivan Avrutsky, et al., entitled "Super-resolution in laser annealing and ablation," Applied Physics Letters, vol. 84, No. 13, Mar. 29, 2004, pp. 2391-2393.

S. De Unamuno, et al., entitled "A Thermal Description of the Melting of c- and a-Silicon Under Pulsed Excimer Lasers," Applied Surface Science 36 (1989), pp. 1-11.

A.M. Prokhorov, et al., entitled "Laser-induced Surface Gratings," Nonlinear Surface Electromagnetic Phenomena, Edited by H.E. Ponath, et al., Elsevier Science Publishers B.V., 1991), pp. 525-560.

* cited by examiner

METHOD OF FORMING MICRO-STRUCTURES AND NANO-STRUCTURES

CROSS-REFERENCE TO RELATED APPLICATION

This application claims the benefit of U.S. Provisional Application No. 60/681,295, filed on May 16, 2005, entitled "METHOD OF FORMING MICRO-STRUCTURES AND NANO-STRUCTURES," the entire contents of which are incorporated herein by reference.

FIELD OF THE INVENTION

The present invention relates to systems and methods of forming micro-structures and nano-structures having nano-tips that may be used for electron field emission and other applications.

BACKGROUND OF THE INVENTION

High-intensity pulsed laser radiation is used to modify surfaces of materials and fabricate technologically desirable structures on a micrometer and sub-micrometer level. Besides their technological importance, such surface modifications are currently of substantial scientific interest. Although adequate, current processes involved in such radiation interactions are relatively complex and non-equilibrium due to high heating and cooling rates, large temperature gradients, and a variety of chemical and photochemical transformations. Such processes and their interplay are often not fully understood, providing a need for systematic studies of laser irradiation of materials as a function of a certain set of parameters.

Thus, improved, reliable, simple and low-cost techniques for fabrication of micro-structures and nano-structures having nano-tips of silicon and other semiconductor and metal materials are needed. Moreover, relatively large, high-density arrays of such nano-tips, are desirable in a number of electron field emission applications.

BRIEF SUMMARY OF THE INVENTION

The present invention generally provides a method of forming micro-structures and nano-structures having nano-tips that can be used in field emission and other applications. Embodiments of the present invention provide efficient ways of fabricating such nano-structures for electron field emission and other applications.

In one example, the method of forming a nano-structure for electron extraction comprises irradiating an area of a first surface of a thermal conductive film to melt the area across the film. The film is insulated at a second surface thereof to provide two-dimensional heat transfer across the film. The liquid density of the film is greater than the solid density thereof. The method further comprises cooling the area inwardly from the periphery thereof to form the nano-structure having an apical nano-tip.

In another example, the thermal conductive film is disposed on a substrate configured to insulate the thermal conductive film for two-dimensional heat transfer across the film. In this example, the substrate has a low thermal conductivity relative to the film.

Further aspects, features, and advantages of the invention will become apparent from consideration of the following description and the appended claims when taken in connection with the accompanying drawings.

DETAILED DESCRIPTION OF THE INVENTION

An example of the present invention comprises a method of forming micro-structures and nano-structures with relatively cone shapes having an apical nano-tip by laser pulse on an area of a thermally conductive film. The thermally conductive film is configured to be insulated for two-dimensional heat transfer across the film. As a result, a nano-structure is formed that can be used in field emission and other applications. The apical nano-tip of the structure has a radius of curvature of up to about 80 nanometers. In one example, a substrate is configured to insulate the film for the two-dimensional heat transfer across the film. The substrate has a low thermal conductivity relative to the film to substantially insulate the thermal conductive film on a surface and provide two-dimensional heat transfer thereacross.

The thermal conductive film is preferably comprised of a material or materials having a relatively high thermal conductivity. In this example, thermal conductivity is defined as the quantity of heat transmitted, due to unit temperature gradient, in unit time under steady state conditions in a direction normal to a surface of unit area, when the heat transfer is dependant on the temperature gradient. Moreover, thermal conductivity may also be defined as heat flow rate/(distance× temperature gradient). The thermal conductive film may comprise at least one of the following materials: crystalline silicon, germanium, silicon carbide, and gallium arsenide. Preferably, the thermal conductive film is crystalline silicon. However, other suitable thermally conductive materials may be used without falling beyond the scope or spirit of the present invention.

Preferably, the film has a thermal conductivity which is about 100 times that of the substrate. Preferably, film has thermal conductivity 1.5 W/cm-K and the substrate has one of 0.014 W/cm-K. In this example, the thermal conductive film has a film thickness of between about 10 nanometers (nm) and 3,000 nm. More preferably, the thermal conductive film has a film thickness of between about 100 nm and 1,100 nm.

The thermal conductive film used in the present invention has a characteristic wherein the density in its liquid state is greater than its density in the solid state. As will be described in greater detail below, a nano-structure that can be used in field emission and other applications is formed on the thermal conductive film generally due to the characteristic that greater mass per volume is present in the liquid state of the thermal conductive film than the solid state thereof.

Figure 1A:
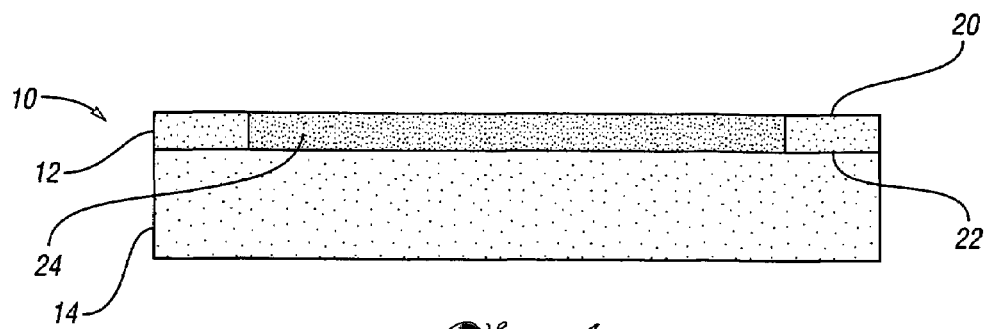
FIG. 1a is a side view of a conceptual image of an insulated thermal conductive film prior to irradiation in accordance with one example of the present invention.

FIG. 1a illustrates a sample 10 including a thermal conductive film 12 disposed on an insulating substrate 14. As shown, the film 12 includes a first surface 20 and an opposite second surface 22 disposed on the insulating substrate 14 adjacent the second surface 22 for insulating the film 12. The substrate 14 substantially insulates the thermal conductive film 12 at the second surface 22 to provide for two-dimensional heat transfer across the thermal conductive film. This is accomplished by configuring the substrate 14 to have a low thermal conductivity relative to the thermal conductive film 12. Thus, in this embodiment, the substrate 14 has a thermal conductivity substantially lower than the thermal conductive film 12 to allow for the two-dimensional heat transfer across the thermal conductive film 12. In one example, the substrate 14 has a thickness of between about one micron and 0.5 millimeters. The substrate may be made of at least one of the following materials: silicon oxide, silicon nitride, silicon oxynitride, glass, and high density polymer. However, it is to be noted that any other suitable material may be used without falling beyond the scope or spirit of the present invention. In this example, the thermal conductive film disposed on the substrate is a silicon-on-insulator (SOI) wafer comprised of 200 nm single crystal silicon bonded to a silica glass substrate.

Figure 1B:
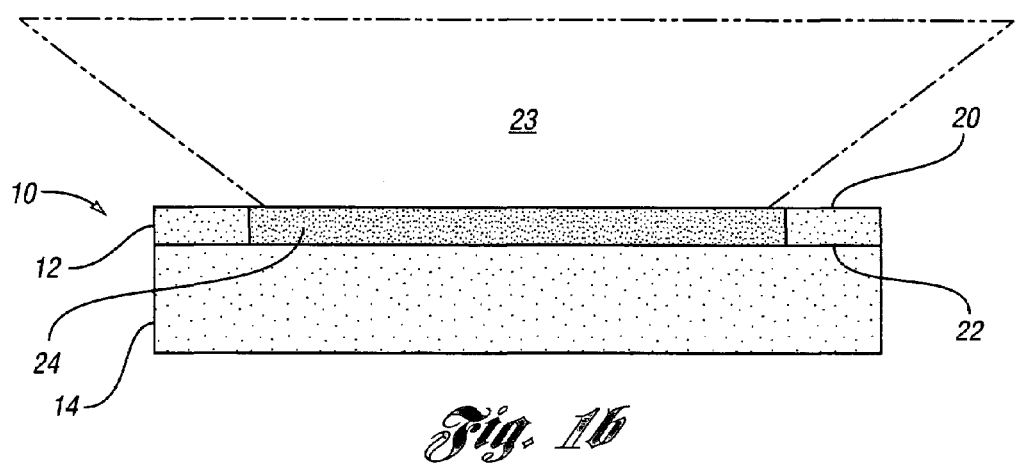
FIG. 1b is a side view of a conceptual image of the thermal conductive film in FIG. 1a under irradiation by a laser pulse.

The thermal conductive film-substrate sample is preferably placed on a fabrication, XYZ-motion stage for irradiation. In accordance with this example of the present invention, a source of energy 23 is used to emit a laser pulse onto an area 24 of the first surface of the thermal conductive film 12 as shown in FIG. 1b. An excimer laser system is used in this example. A laser pulse 23 irradiates an area 24 on the first surface of the thermal conductive film to melt the area across the film. The substrate, preferably disposed at the second surface of the thermal conductive film, insulates the second surface thereof. This provides a two-dimensional heat transfer across the thermal conductive film. Thus, merely lateral heat transfer across the film is accomplished to melt the irradiated area on the first surface.

In this example, the laser pulse is irradiated on the area having a duration of about 30 nano-seconds at a wavelength ($\lambda$) of about 250 nanometers and a fluence of between about 0.1 and 10 $J/cm^2$-ns. In this example, the fluence of the laser pulse is at about 1.5 $J/cm^2$. For example, a spatially homogenized, single pulse of radiation from a KrF excimer laser (e.g., $\lambda=248$ nm, Lambda Physik model LPX 205i) may be used to image a pinhole onto an illuminated circular spot on a thermal conductive silicon sample surface by means of a projection system with a demagnification factor of 8.9 and a resolution limit of 2 μm. A pinhole mask with a diameter of 50 μm may be used to produce a laser spot with a diameter of about 5.6 μm at the sample surface. The laser processing may be performed in ambient conditions.

As shown in FIG. 1b, as the irradiated area 24 melts, the density of the irradiated area increases due to the characteristic of the thermal conductive film, i.e., the density of the thermal conductive film is greater in its liquid state than the density in its solid state. The area has a heat diffusion length of between about 1 micron and 3 microns, and preferably between about 1.5 micron and 2 microns. In this example, the laser pulse is of a circular shape defining the irradiated area. As such, a round and relatively flat circular depression is formed having the diameter which generally corresponds to the size of the laser spot/pulse. In this example, the depression is about 40 nm below the first surface.

Figure 1C:
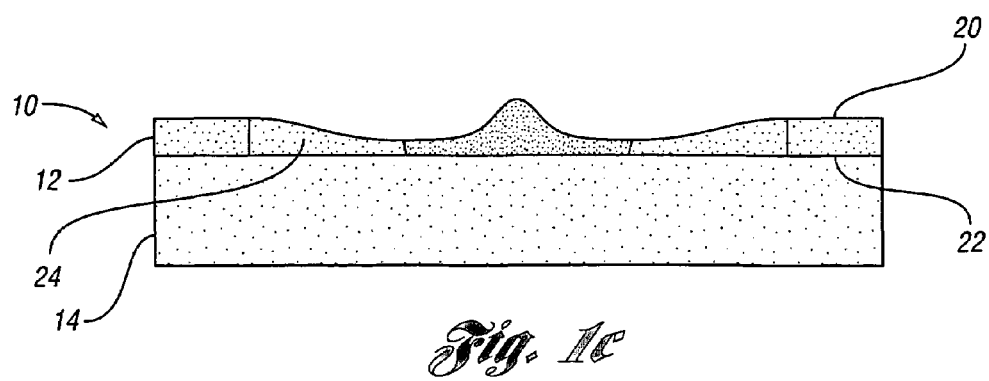
FIG. 1c is a side view of a conceptual image of the thermal conductive film having a nano-structure formed thereon after irradiation.

After irradiating the area to melt the area across the thermal conductive film in a two-dimensional heat transfer fashion thereacross, the area rapidly self-cools at room temperature to solidify the melted area. As shown in FIG. 1c, from its periphery, the area 24 in liquid state cools inwardly to form a nano-structure 30 having an apical nano-tip 32. In this example, the nano-structure 30 is a nano-cone. However, as will be discussed below, the nano-structure may take on other structural shapes, e.g., a nano-ridge, without falling beyond the scope or spirit of the present invention. In this example, the apical nano-tip has a radius of curvature of up to about 80 nm and has a base having a diameter of about 1.5 micron and a height of about 1 micron. Sample surface topography may be examined by contact-mode atomic force microscopy (AFM) on a Park Autoprobe LS AFM system using Contact Ultralever® tips.

Figure 2:
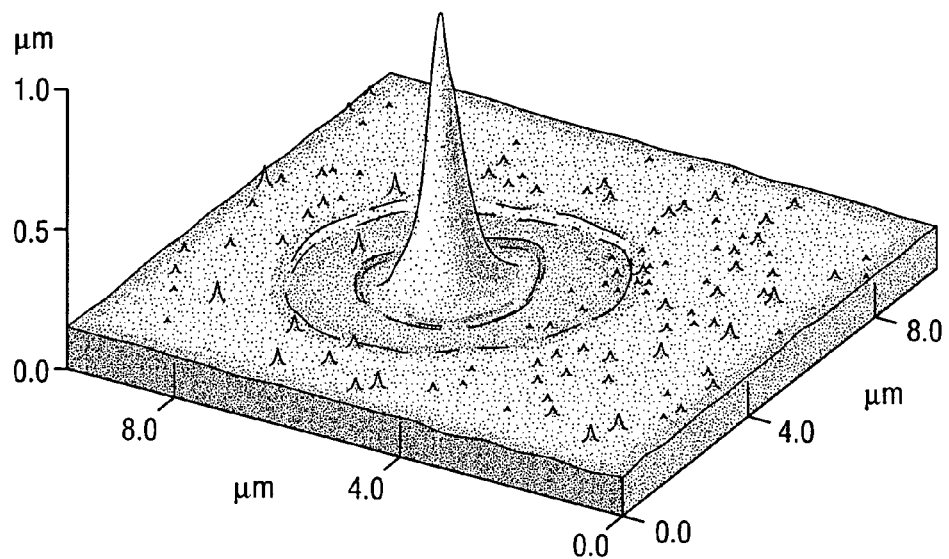
FIG. 2 is an illustration of an atomic force microscopy (AFM) image of a nano-structure fabricated in accordance with one example of the present invention.

FIG. 2 illustrates an AFM image of a nano-cone fabricated by a single pulse at a fluence of 1.5 $J/cm^2$. For clarity, the z-scale of the image has been expanded by a factor of about four to show the size and shape and of the tip along with the changes in the surrounding irradiated area. As shown, the area has a round and relatively flat circular depression, the diameter of which roughly corresponds to the size of the laser spot. The depression is about 40 nm below the original surface. The nano-cone has a generally conical shape with a base of diameter of 1.5 μm and height of 1 μm from the depression. The apparent radius of curvature of the tip apex is about 50 nm as estimated using the AFM scan.

Figure 3:
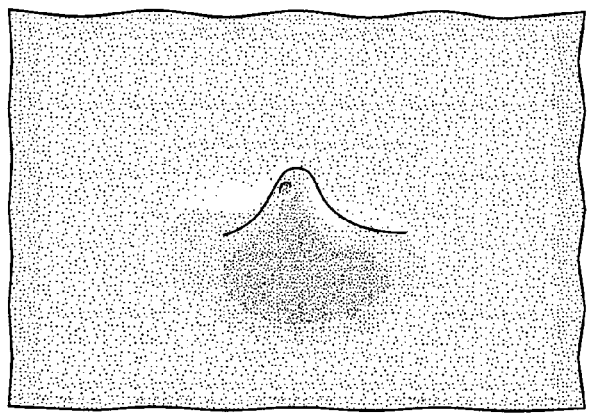
FIG. 3 is an illustration of a scanning electron microscopy (SEM) image of a nano-structure fabricated by a laser pulse in accordance with one example of the present invention.

As shown in FIG. 3, the samples were also imaged by scanning electron microscopy (SEM) on a JEOL JSM 6300F electron microscope at an accelerating voltage of 5 KeV and a sample tilt of 60 deg relative to the electron beam. The radius of curvature mentioned above was in good agreement with the SEM image of a nano-structure fabricated under the same conditions and shown in FIG. 3.

It has been found that the thermal conductive film and the interplay of material properties of the film and the substrate contribute to the formation of the nano-structure. Although not wanting to be limited to theory, it is believed that limiting the dissipation of heat from the laser-heated spot to predominantly lateral (2D) transfer within the film is a contributing factor. In this example, such a 2D heat transfer pattern results from the considerably lower thermal conductivity of the silica substrate (0.014 W/cm-K) compared to that of silicon (1.5 W/cm-K). Another contributing factor is that Si has higher density ($\rho$=2.52 g/cm$^3$) in its liquid state than in its solid state ($\rho$=2.32 g/cm$^3$ for crystalline Si and $\rho$=2.2 g/cm$^3$ for amorphous Si).

Under the conditions of irradiation, the silicon under the irradiated spot is melted and then it rapidly self-cools and solidifies. It is believed that the dynamics and the geometry of the solidification process, contributes to the formation of the nano-structure. Due to the lateral heat dissipation, the edges of the area or spot are more rapidly cooled and have lower temperature than its central region. Thus, the solidifying or freezing front moves from the edges to the center and pushes the remaining liquid silicon toward the center. This solidification process of fast displacement of liquid silicon toward the center is enhanced by the fact that the solidified material occupies larger volume. In this example, it results in the formation of a jet or cone, that upon complete solidification forms a nano-structure having nano-tips.

Figure 4:
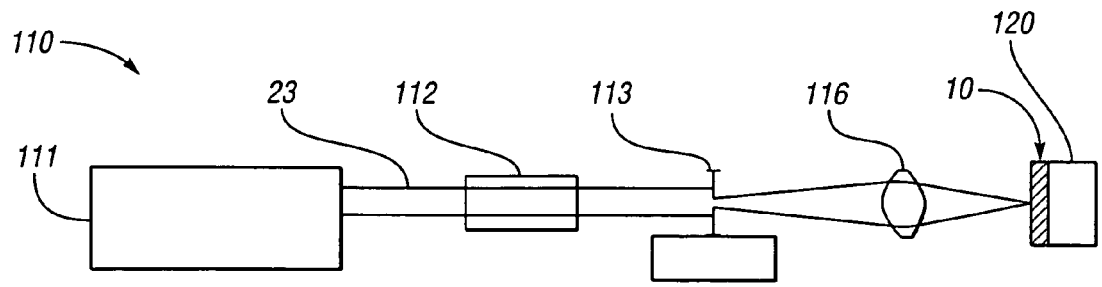
FIG. 4 is a schematic representation of a fabrication system for forming nano-structures in accordance with one example of the present invention.

FIG. 4 depict a computer controlled and operated system 110 for forming a nano-structure for electron extraction in accordance with one example of the present invention. The system 110 may be controlled and operated by a computer or central processing unit (cpu) as known in the art. As shown, the system 110 includes an energy source such as a laser 111 to emit a laser beam/pulse 23. In this example, the energy source is a KrF excimer laser. An excimer laser is a form of ultraviolet chemical laser which is commonly used in lithography. The term excimer is short for excited dimmer (a molecule composed of 2 subunits linked together), and refers to the chemical gain medium of the laser. The gain medium is defined as a determining factor of the wavelength of operation of the laser.

System 110 shown in FIG. 4 further includes an optical beam homogenizer 112 which is configured to redistribute the energy into a substantially uniform beam. A beam homogenizer typically breaks up the laser beam into sections and recombines them in a pattern that increases the overall fluence over a cross-section defining a homogenized beam. In this example, the homogenizer includes two, crossed 5×10 arrays of cylindrical lenses and serves to shape the laser beam to a 17×17 millimeter uniform-intensity at a mask holder location along the beam path. The term "uniform-intensity" may be defined as a uniformity better than 90%.

The homogenized beam 111 is then directed to a projection mask 113 as shown. The mask 113 is a plate of material that is transparent at a certain wavelength, e.g., silicon oxide at ultraviolet wavelengths, coded according to a certain pattern with material that does not transmit at the same wavelength, e.g., chrome, aluminum. The projection mask defines the pattern irradiated on the area. The laser beam scans the entire mask area and the image of the etched mask is transmitted on the area. In this example, the projection mask is imaged onto the sample surface by the objective lens mentioned below.

The system further includes an objective lens 116, e.g., ultraviolet (UV) objective lens. In this example, the objective lens 116 collects light emanating from the projection mask and images it unto the sample. In this example, the objective lens is of type x/4-248, an optical system that includes a tube lens at an entrance, and has a resolution of about 2 micrometers.

The system further includes an XYZθ motion stage 120 on which the sample is placed for irradiation. In one example, the stage 120 is a combination of Newport PM500 -33LR XYθ stage and PM500 1V vertical motorized, computer-controlled stages. The stage serves to properly position the sample in the XY plane and insure proper focusing (positioning in the Z direction).

In this example, the wavelength of the laser radiation is between about 50 nm and 10 microns. The pulse duration is between about 0.1 ns and 1,000 ns. It is to be understood that the laser pulse may be derived from other systems and light sources including ultraviolet, visible, and infrared, without falling beyond the scope or spirit of the present invention.

EXAMPLE 1

This example provides a method of forming a nano-structure having a nano-tip for enhanced electron extraction. In this example, spatially homogenized, single pulses of radiation from a KrF excimer laser ($\lambda$=248 nm, Lambda Physik, model LPX 205) were used to image pinholes onto uniformly illuminated circular spots on a silicon sample surface. This was accomplished via a projection system with a demagnification factor of 8.9 and a resolution limit of 2 micrometers. Irradiation was performed on commercially acquired silicon-on-insulator (SOI) wafers comprising 200 nm single-crystal silicon (Si) bonded to a silica glass substrate.

In addition, SOI wafers that comprised of a single-crystal Si layer on 1 μm layer of silica on a bulk Si substrate (SOIS) were used. The samples were plasma-etch-thinned to different thicknesses of the Si layer in the range of between about 0.8 and 4.1 μm. The laser processing was performed in ambient, clean-room conditions, and the sample surface topography was then examined by contact-mode atomic force microscopy (AFM) on a Park Autoprobe LS AFM system using Contact Ultralever® tips. Some samples were coated with a thin layer of Au and then imaged by scanning electron microscopy (SEM) on a JEOL JSM 6300F electron microscope at an accelerating voltage of 5 KeV and a sample tilt of 60 deg relative to the electron beam. The samples were allowed to self-cool and solidify at room temperature to form nano-structures having nano-tips that can be used in field emission and other applications.

Figure 5A:
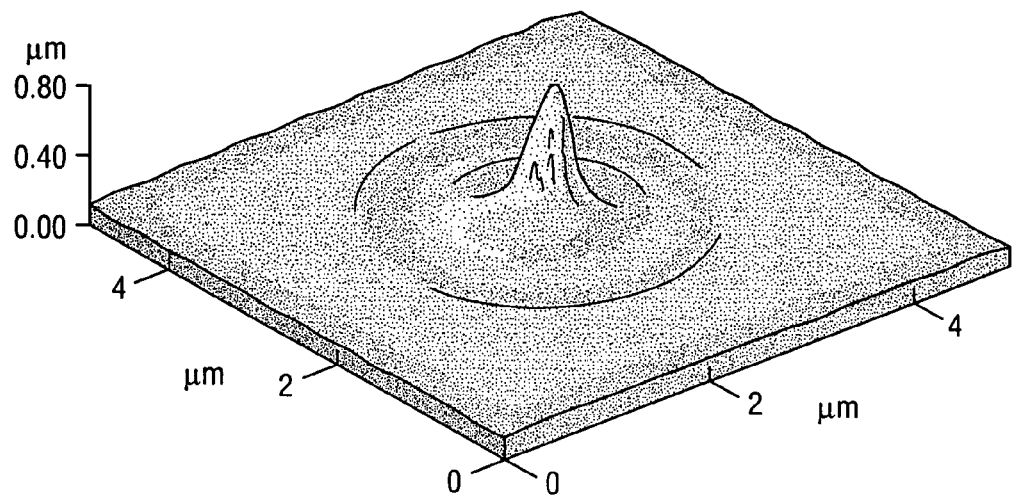
FIG. 5a is an illustration of an AFM image of a nano-structure fabricated in accordance with another example of the present invention.
Figure 5B:
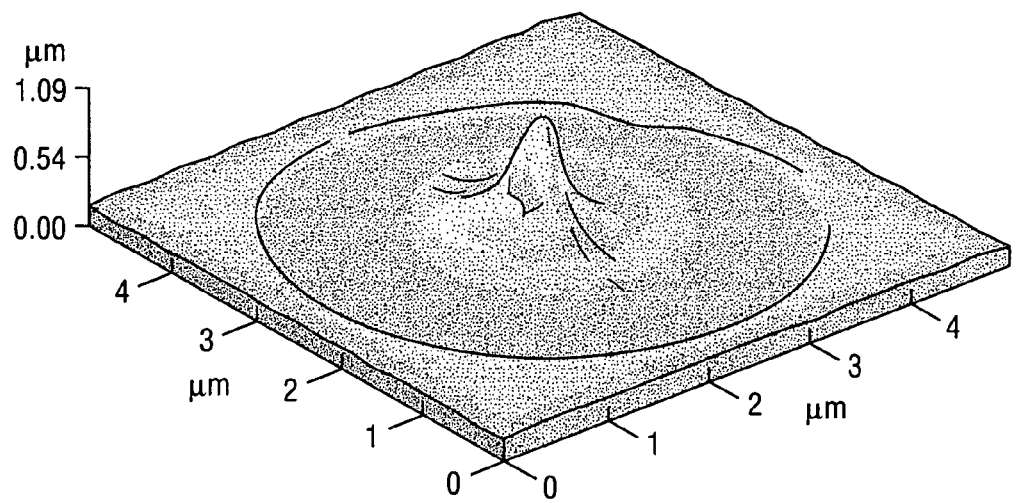
FIG. 5b is an illustration of an AFM image of a nano-structure of another example of the present invention.
Figure 5C:
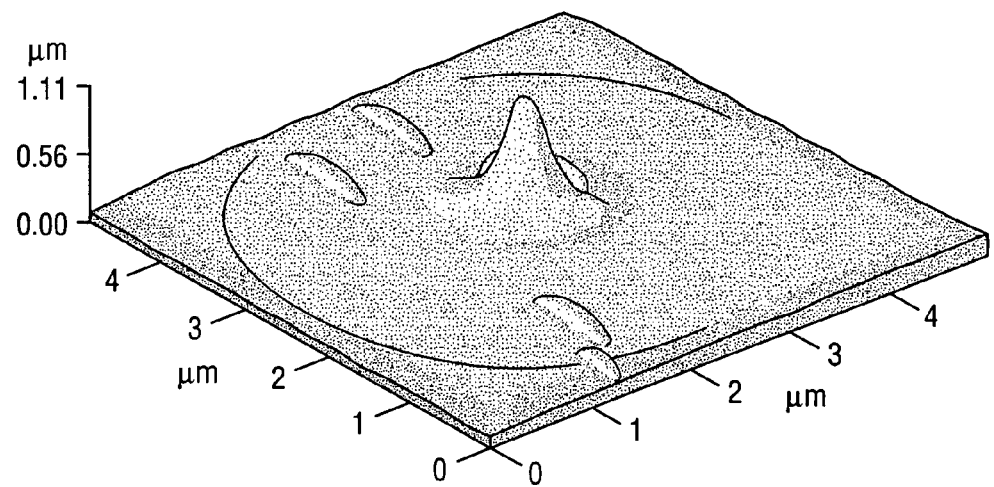
FIG. 5c is an illustration of an AFM image of a nano-structure of another example of the present invention.

AFM images of nano-structures fabricated by single pulses at a fluence of 1.5 J/cm$^2$ are shown in FIGS. 5a-5c for instance. For clarification, the z-scale of the images was expanded by a factor of about 2 to more clearly depict the size and shape and of the nano-structures and the changes in the surrounding irradiated area. The areas were observed to have round and relatively flat circular depressions, the diameters of which generally corresponded to the size of the laser spot. Each depression was measured to be several tens of nanometers below the original surface and having a nano-structure formed at about the center of the depression.

Pinhole masks were used to make the nano-structures in FIGS. 5a-5c. As a result, areas with diameters 30, 40, and 50 μm were produced by the laser spots having diameters 3.4, 4.5, and 5.6 μm, respectively. The apparent radius of curvature of each of the apical nano-tips was about 50 nm using the AFM scan. This radius was in relative agreement with the FESEM image of a nano-structure fabricated with a 50 μm mask shown in FIG. 6.

Figure 6:
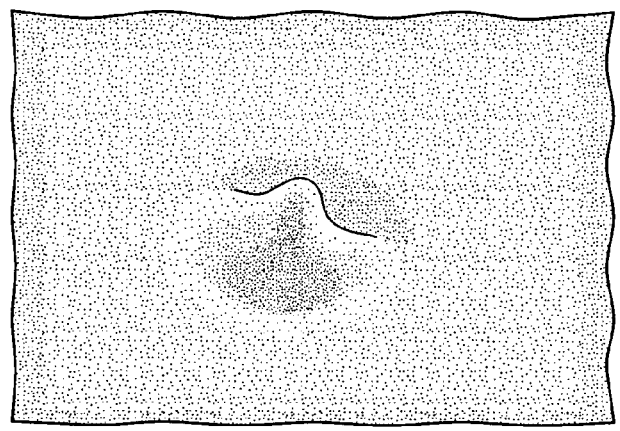
FIG. 6 is an illustration of a FESEM image of a nano-tip of the nano-structure in FIG. 5c.
Figure 7:
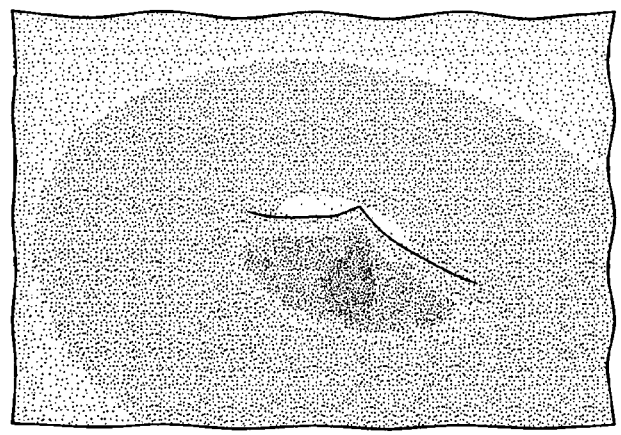
FIG. 7 is an illustration of a FESEM image of a nano-tip of another example of the present invention.

Fluence thresholds ("thresholds") were estimated for observable changes as a result of a single pulse irradiation. The thresholds were estimated to be about 0.8 J/cm$^2$ for the 50 μm mask, 1.0 J/cm$^2$ for the 40 μm mask, and 1.25 J/cm$^2$ for the 30 μm mask. When pulses with higher fluences (e.g. above about 2.0 J/cm$^2$) were used, a sub-micron hole through most of the Si film thickness developed in the center of the nano-structure and the base of the nano-structure widened. FIG. 6 depicts a FESEM image of a nano-structure fabricated with a 50 µm-diameter pinhole mask at a 1.5 J/cm² and FIG. 7 illustrates a FESEM image of a nano-structure fabricated with a 50 µm-diameter pinhole mask at 1.25 J/cm². For the nano-structure shown in FIG. 7, a reduction in the apical radius of curvature was estimated to be about 30 nm. The diameter of the depression around the tip, and the height of the tip were clearly seen upon this decrease in the fluence. When a larger pinhole mask, e.g., 100 µm diameter, was used, no nano-structure was formed. Only ablation holes were obtained from above a threshold of about 0.6 J/cm².

EXAMPLE 2

Figure 8:
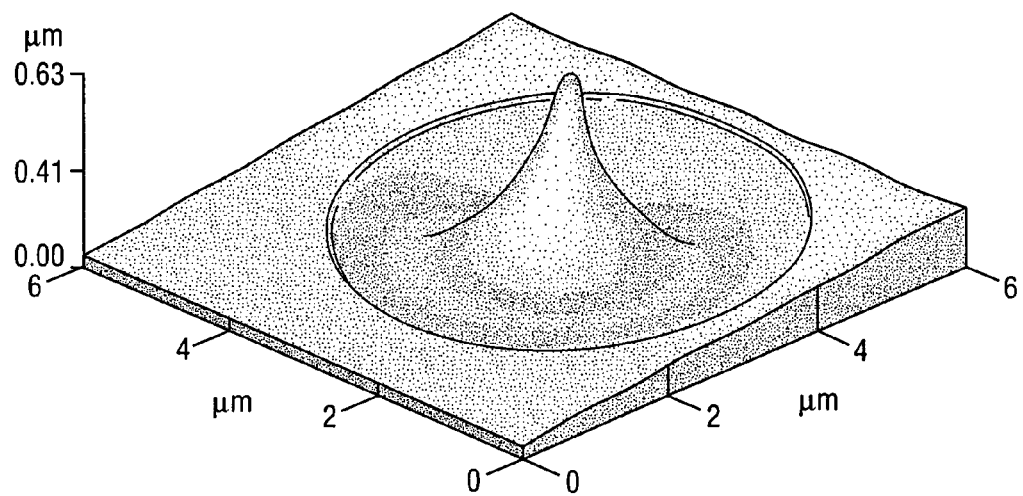
FIG. 8 is an illustration of an AFM image of a nano-structure of yet another example.
Figure 9:
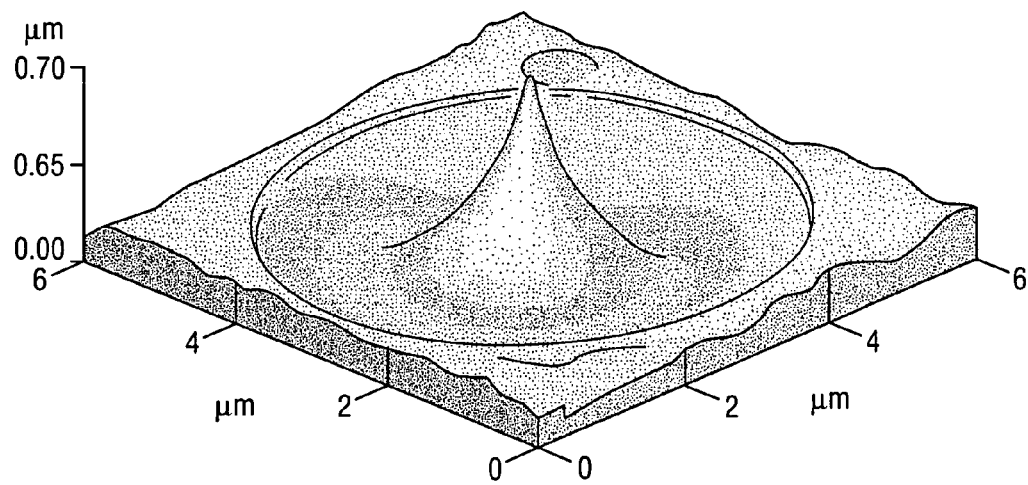
FIG. 9 is an illustration of an AFM image of a nano-structure of still another example.
Figure 10:
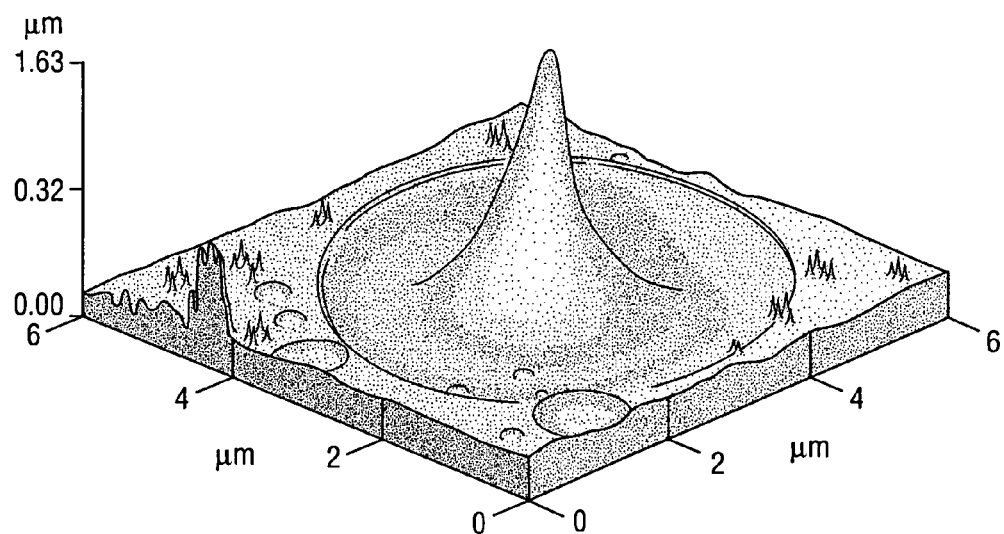
FIG. 10 is an illustration of an AFM image of a nano-structure of another example.

In this example, fabrication of nano-structures was attempted on SOIS samples with Si film thicknesses of about 0.8 µm, 1.1 µm, 2.3 µm and 4.1 µm. When using a 50 µm pinhole projection mask, there were no observable changes on the surfaces of the films with thicknesses of between about 2.3 and 4.1 µm after single-pulse irradiation with fluences up to 3.0 J/cm². In the 0.8 µm and 1.1 µm film thickness cases, thresholds were measured to be about 1.5 and 1.75 J/cm², respectively. FIGS. 8-10 show AFM images of nano-structures that were made on SOIS samples using a 50 µm pinhole mask. The nano-structure shown in FIG. 8 was fabricated on a 0.8 µm-Si film. The nano-structure depicted in FIG. 9 was fabricated on a 1.1 µm-Si film. Both nano-structures above were irradiated at a fluence about 2.0 J/cm². The nano-structures also include relatively very sharp nano-tips, having a radius of curvature of between about 30 nm and 50 nm. The 0.8 µm-Si sample had a height of about 0.7 µm and the 1.1 µm-Si sample had a height of about 0.6 µm. Upon increasing the single-pulse fluence up to about 3 J/cm², relatively sharp nano-structures were obtained with relatively larger heights and without craters or any considerable flattening at the apical nano-tip.

FIG. 10 shows an AFM image of a nano-structure fabricated on a 1.1 µm thick Si film with a fluence of 2.75 J/cm²: The height was measure to be about 1.5 µm and was considerably larger than that of a nano-structure formed by a fluence of about 2.0 J/cm².

EXAMPLE 3

Figure 11:
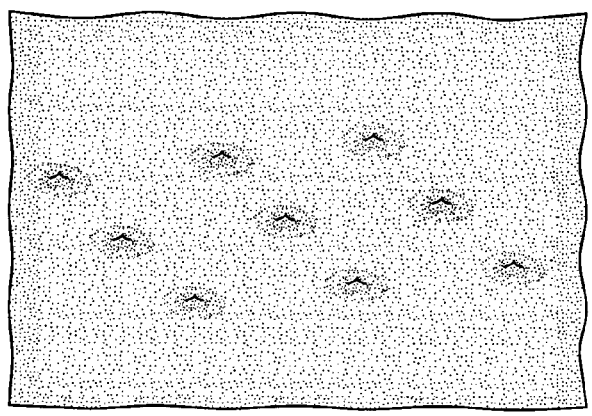
FIG. 11 is an illustration of a FESEM image of an array of nano-structures fabricated consecutively by single laser pulses in accordance with another example of the present invention.

This example provides a method of forming a plurality of nano-structures on a film, each of the nano-structures having a nano-tip that can be used in field emission and other applications. In this example, consecutive 1.5 J/cm² single pulses were irradiated on a silicon sample after translation steps with the sample-supporting XYZ stage. The sample was allowed to self-cool and solidify. FIG. 11 shows a 3×3 array of nano-structures that were fabricated by the consecutive single pulses were applied to the sample. As depicted in FIG. 11, this example also illustrates the reproducibility of the fabrication process and the potential for obtaining relatively dense arrays of plurality of such nano-structures by using, for example, a mask with multiple finely spaced pinholes.

EXAMPLE 4

Figure 12A:
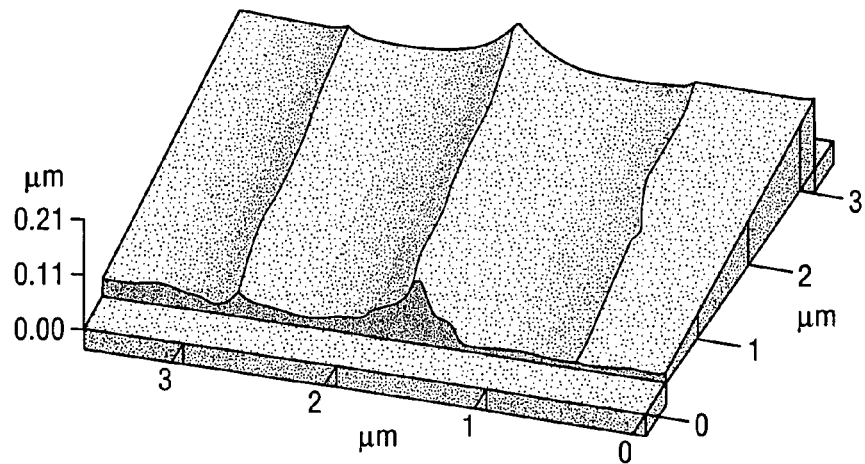
FIG. 12a is an illustration of an AFM image of a nano-ridge in accordance with another example of the present example.
Figure 12B:
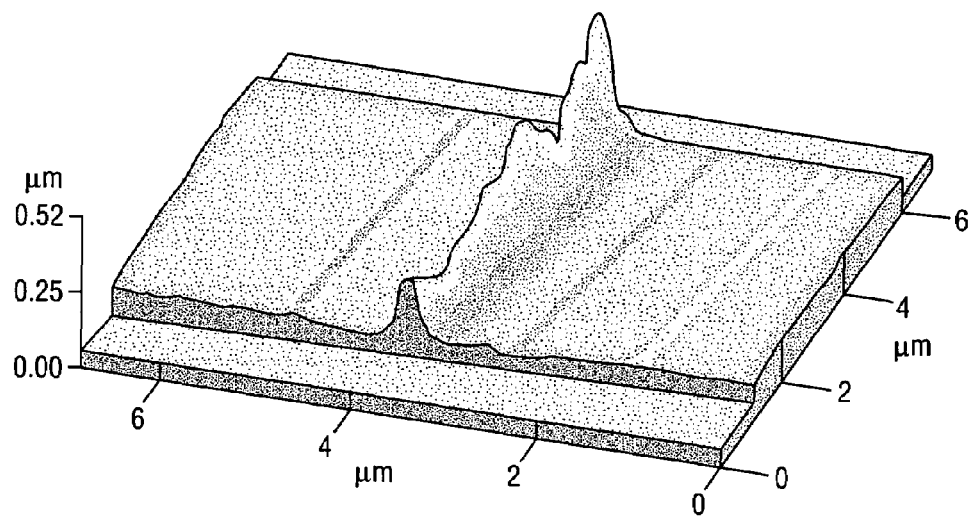
FIG. 12b is an illustration of another AFM image of another nano-ridge.
Figure 12C:
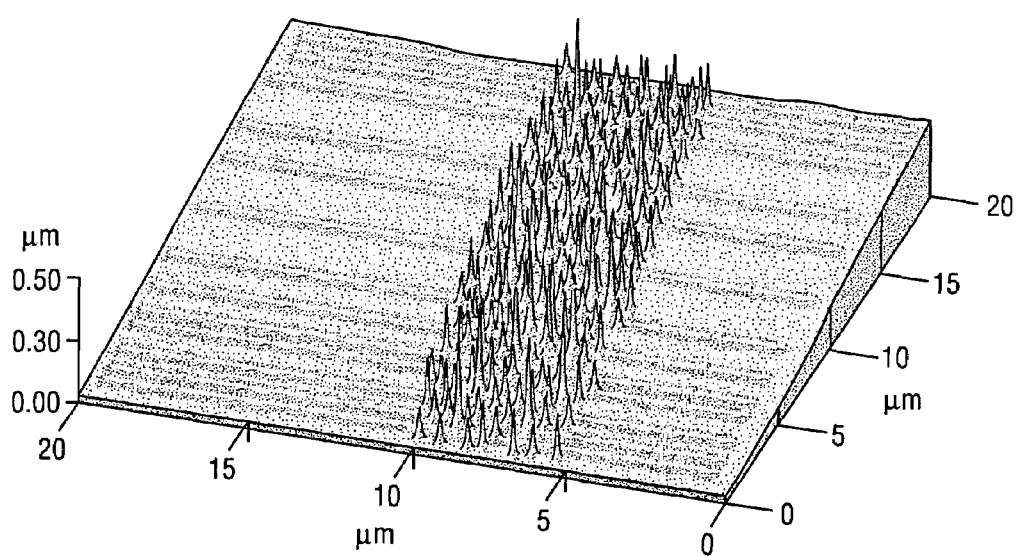
FIG. 12c is an illustration of yet another AFM image of yet another nano-ridge.

This example provides a method of forming a nano-ridge with a nano-tip. In this example, a slit projection mask was used having widths that were comparable to the diameters of the pinhole masks used above. The surface of an SOI sample was irradiated as mentioned above. FIGS. 12a-12c illustrate AFM images of structures that were obtained upon using slits with 3 different widths on a 200 nm Si-film SOI sample. It was observed that slit widths of 25 µm and 50 µm formed ridge structures having laser lines with widths 2.8 µm and 5.6 µm, respectively. Such ridges were measured to have apical radii of curvature in the range between about 50 nm and 100 nm. The ridges were termed "nano-ridges." As shown in FIG. 12c, a slit with a width of about 100 µm produced only an ablated line with raised edges and a ridge structure.

Moreover, it was observed that the threshold for surface changes when a slit was used having a width 50 µm was 0.7 J/cm², i.e. slightly lower than that for a circular spot with the same diameter. The fluence range within which nano-ridges formed was between about 0.1 J/cm² and 0.2 J/cm² above the threshold. At higher fluences, it was observed that the ridges break into ridge-valley-ridge structures.

Thus, conditions have been found for the formation of nano-structures, e.g., nano-cones and nano-ridges, on single-crystal Si films with thicknesses from 0.2 µm to 1.1 µm on silica or oxidized silicon substrates by single-pulse irradiation with KrF excimer laser radiation. The estimated threshold values and the formation dependence on film thickness and irradiation spot/line sizes can be explained in the frame of a qualitative model for the mechanism of formation that is contributed by two-dimensional heat transfer and solidification-front-driven movement of melted material.

Further description of the present invention may be found in "Controllable Excimer-Laser Fabrication of Conical Nano-Tips on Silicon Thin Films," *Applied Physics Letters*, Vol. 84, No. 24 (14 Jun. 2004), D. G. Georgiev et al. and "Systematic Study of the Formation of Nano-Tips on Silicon Thin Films by Excimer Laser Irradiation," *Micro- and Nanosystems—Materials and Devices* (*Mater. Res. Soc. Symp. Proc.*, Vol. 872 (2005)), J13.6 (2005), D. G. Georgiev et al. (also published online at the following internet address: http://www.mrs.org/publications/epubs/proceedings/spring2005/j/index.html), the entire contents of each are incorporated herein by reference.

While various embodiments for carrying out the invention have been described in detail, those familiar with the art to which this invention relates will recognize various alternative designs and embodiments for practicing the invention as defined by the following claims.

The invention claimed is:

1. A method of forming a nano-structure, the method comprising:
   irradiating an area on a first surface of a thermal conductive film to melt the area across the film, the film being insulated at a second surface thereof to provide two-dimensional heat transfer across the film, the liquid density of the film being greater than the solid density thereof; and
   cooling the area inwardly from the periphery thereof to form the nano-structure having an apical nano-tip.

2. The method of claim 1 wherein the thermal conductive film comprises at least one of the following materials: crystalline silicon, germanium, silicon carbide, and gallium arsenide.

3. The method of claim 1 wherein the thermal conductive film has a film thickness of between about 10 nano meters (nm) and 3,000 nm.

4. The method of claim 1 wherein the thermal conductive film has a film thickness of between about 100 nm and 1,100 nm.

5. The method of claim 1 wherein the area has a diameter of between about 5 and 10 microns.

6. The method of claim 1 wherein the area has a width of between about 5 and 10 microns.

7. The method of claim 1 wherein the area has a heat diffusion length of between about 1 and 3 microns.

8. The method of claim 1 wherein the film is disposed on an insulating substrate adjacent the second surface for insulating the film to provide for two-dimensional heat transfer across the film, the substrate having a low thermal conductivity relative to the film.

9. The method of claim 8 wherein the substrate has a thickness of between about 1 micron and 0.5 millimeters.

10. The method of claim 8 wherein the substrate is made of at least one of the following materials: silicon oxide, silicon nitride, silicon oxynitride, glass, and high density polymer.

11. The method of claim 8 wherein the film has a thermal conductivity of about 1.5 W/cm-K and the substrate has a thermal conductivity less than the thermal conductivity of the film.

12. The method of claim 1 wherein the nano-structure includes at least one of the following structures: nano-cone and nano-ridge.

13. The method of claim 1 wherein the apical nano-tip has a radius of curvature of between about 10 nm and 100 nm.

14. The method of claim 1 wherein the nano-structure includes a base having a diameter of about 1.5 micron and a height of about 1 micron.

15. The method of claim 14 wherein the area includes a depression of about 40 nm defining the periphery of the area, the base of the nano-structure extending therefrom.

16. The method of claim 1 wherein the step of irradiating includes:
    emitting a single energy pulse;
    homogenizing the pulse to shape the laser pulse to a predetermined intensity;
    imaging the shape of the pulse defining the periphery of the area of the thermal conductive film; and
    melting the area of the film.

17. The method of claim 16 wherein the pulse is emitted at about 30 nano-seconds at a wave length of about 250 nm and a fluence at between about 0.1 and 10 J/cm$^2$.

18. The method of claim 16 wherein the energy pulse is from one of the following sources: ultraviolet, visible, non-laser light, and infrared.

19. The method of claim 18 wherein the wavelength of the pulse is between about 50 nm and 10 microns.

20. The method of claim 19 wherein the pulse duration is between about 0.1 ns and 1,000 ns.

21. The method of claim 1 wherein the step of cooling includes solidifying the area to form the nano-structure for electron extraction.

22. The method of claim 1 wherein the area is a first area, the nano-structure is a first nano-structure, and the nano-tip is a first nano-tip.

23. The method of claim 22 further comprising:
    moving the thermal conductive film;
    irradiating a second area on the first surface of the thermal conductive film to melt the second area across the film; and
    cooling the second area inwardly from the periphery thereof to form a second nano-structure having a second apical nano-tip for enhanced electron extraction.

24. The method of claim 1 wherein the liquid density of the film is greater than the solid density of the film.

25. A method forming a nano-structure, the method comprising:
    irradiating an area on a first surface of a thermal conductive film to melt the area across the film, the film being insulated at a second surface thereof to provide two-dimensional heat transfer across the film, the liquid density of the film being greater than the solid density thereof; and
    cooling the area inwardly from the periphery thereof to form the nano-structure having an apical nano-tip.

26. A method of forming micro-structures and nano-structures, the method comprising:
    irradiating an area on a thermal conductive film disposed on a substrate to melt the area across the film, the liquid density of the thermal conductive film being greater than the solid density thereof, the substrate configured to insulate the thermal conductive film for two-dimensional heat transfer across the film and having a low thermal conductivity relative to the film; and
    cooling the area inwardly from the periphery thereof to form a nano-jet having a conical nano-tip at the center for electron extraction.

* * * * *